(12) United States Patent
Park et al.

(10) Patent No.: US 12,393,349 B2
(45) Date of Patent: Aug. 19, 2025

(54) NONVOLATILE RESISTIVE MEMORY DEVICE USING DYNAMIC REFERENCE IN DUAL DOMAIN AND READ METHOD THEREOF

(71) Applicant: Korea University Research and Business Foundation, Seoul (KR)

(72) Inventors: Jongsun Park, Seoul (KR); Joo Yoon Kim, Gwangmyeong-si (KR)

(73) Assignee: Korea University Research and Business Foundation, Seoul (KR)

( * ) Notice: Subject to any disclaimer, the term of this patent is extended or adjusted under 35 U.S.C. 154(b) by 455 days.

(21) Appl. No.: 17/961,116

(22) Filed: Oct. 6, 2022

(65) Prior Publication Data
US 2023/0138195 A1   May 4, 2023

(30) Foreign Application Priority Data

Oct. 29, 2021  (KR) .................... 10-2021-0146348

(51) Int. Cl.
*G11C 13/00* (2006.01)
*G06F 3/06* (2006.01)

(52) U.S. Cl.
CPC .......... *G06F 3/0619* (2013.01); *G06F 3/0653* (2013.01); *G06F 3/0679* (2013.01); *G11C 13/0026* (2013.01); *G11C 13/004* (2013.01); *G11C 13/0061* (2013.01)

(58) Field of Classification Search
CPC .... G06F 3/0619; G06F 3/0653; G06F 3/0679; G11C 13/0026; G11C 13/004; G11C 13/0061; G11C 7/062; G11C 7/065; G11C 7/08; G11C 7/14; G11C 27/026; G11C 2013/0054; G11C 2213/79; G11C 11/1655; G11C 11/1673; G11C 11/1693; G11C 2013/0073; G11C 13/0007; G11C 13/0033
USPC ..................................... 365/189.15
See application file for complete search history.

(56) References Cited

U.S. PATENT DOCUMENTS

2020/0105314 A1*  4/2020  Yu .................... G11C 27/026

FOREIGN PATENT DOCUMENTS

| KR | 10-0837282 B1 | 6/2008 |
| KR | 10-1042520 B1 | 6/2011 |
| KR | 10-2019-0093371 A | 8/2019 |
| KR | 10-2019-0122972 A | 10/2019 |
| WO | WO 2008/058264 A3 | 5/2008 |

\* cited by examiner

*Primary Examiner* — Huan Hoang
(74) *Attorney, Agent, or Firm* — NSIP Law

(57) ABSTRACT

Disclosed is a method of reading a nonvolatile resistive memory device including a data cell and a reference cell. The method includes precharging a first bit line connected to the data cell and a second bit line connected to the reference cell, discharging a voltage precharged to the first bit line and the second bit line to a source node through the data cell and the reference cell, sampling a reference voltage developed to the second bit line at a first time when a voltage of the first bit line reaches a threshold voltage, sampling a data voltage developed to the first bit line at a second time when a voltage of the second bit line reaches the threshold voltage, and sensing and amplifying a difference value between the reference voltage and the data voltage and outputting the sensed and amplified difference value as output data.

14 Claims, 9 Drawing Sheets

Variable resistance device
(Rv)

| $S_{DATA}$ | $/S_{DATA}$ | $S_{REF}$ | $/S_{REF}$ | Sample & hold complete voltage | SAE |
|---|---|---|---|---|---|
| 0 | 1 | 0 | 1 | - | 0 |
| 1 | 0 | 0 | 1 | $SA_{REF}$ | 0 |
| 0 | 1 | 1 | 0 | $SA_{DATA}$ | 0 |
| 1 | 0 | 1 | 0 | $SA_{REF}$ & $SA_{DATA}$ | 1 |

NONVOLATILE RESISTIVE MEMORY DEVICE USING DYNAMIC REFERENCE IN DUAL DOMAIN AND READ METHOD THEREOF

CROSS-REFERENCE TO RELATED APPLICATIONS

This application claims priority under 35 U.S.C. § 119 to Korean Patent Application No. 10-2021-0146348, filed on Oct. 29, 2021, in the Korean Intellectual Property Office, the disclosures of which are incorporated by reference herein in their entireties.

BACKGROUND

Embodiments of the present disclosure described herein relate to a semiconductor memory device, and more particularly, relate to a nonvolatile resistive memory device using a dynamic reference in a dual domain including a voltage domain and a time domain, and a read method thereof.

A semiconductor memory device is roughly divided into a volatile memory device and a nonvolatile memory device. Read and write speeds of the volatile memory device are fast, but when a power supply is interrupted, data stored therein disappears. In contrast, the nonvolatile memory device retains data stored therein even though external power supply is discontinued. Therefore, the nonvolatile memory device is used to store contents to be preserved regardless of whether a power is supplied.

In recent years, a resistive memory has emerged as a global concern. The resistive memory device stores data corresponding to logic '0' or '1' based on a difference in resistance size. Unlike a conventional dynamic random access memory (DRAM) or a conventional static random access memory (SRAM), which loses data when a power supply is interrupted, the resistive memory memorizes and stores a series of data even when power is turned off. Based on these characteristics, when the resistive memory is used, leakage power may be reduced by shutting off a power in a standby state. Accordingly, the resistive memory is being used in various fields such as large-capacity memory, neuromorphic hardware, and Internet of Things (IoT) devices.

A read operation of the resistive memory applies a method of applying a current to a device to read data stored in the form of resistance, and sensing a voltage formed at this time. A reference cell having an average value of resistances corresponding to logic values of '0' and '1' and a bit line connected to a cell to be read are precharged with the same voltage. After that, when a current is discharged through each device, the bit line of the cell in which '1' having a larger resistance value than the reference cell is stored is discharged more slowly. On the other hand, the bit line of the cell in which '0' having a smaller resistance value than the reference cell is stored is discharged faster. A sense amplifier (hereinafter referred to as a SA) compares the voltage of the reference cell with the voltage of the cell to be read, and amplifies a voltage difference to a greater extent to complete the read operation.

In the conventional read operation, the read voltage difference formed due to a small resistance difference according to the storage of '0' and '1' data is not large. A read error may occur due to process variations, the influence of an offset voltage of the sense amplifier, or noise. Therefore, there is a need for a technology capable of improving read reliability by compensating for a small resistance difference caused by the storage of '0' and '1' data in the resistive memory.

SUMMARY

Embodiments of the present disclosure provide a resistive memory device capable of providing high read reliability by reducing read errors due to process variations or noise, and a read method thereof.

According to an embodiment of the present disclosure, a method of reading a nonvolatile resistive memory device including a data cell and a reference cell includes precharging a first bit line connected to the data cell and a second bit line connected to the reference cell, discharging a voltage precharged to the first bit line and the second bit line to a source node through the data cell and the reference cell, sampling a reference voltage developed to the second bit line at a first time when a voltage of the first bit line reaches a threshold voltage, sampling a data voltage developed to the first bit line at a second time when a voltage of the second bit line reaches the threshold voltage, and sensing and amplifying a difference value between the reference voltage and the data voltage and outputting the sensed and amplified difference value as output data.

According to an embodiment, the first time may precede or follow the second time depending on a logic value stored in the data cell.

According to an embodiment, when logic '0' is stored in the data cell, the first time may precede the second time.

According to an embodiment, a first reference voltage sampled at the first time may be higher than a second reference voltage at the second time.

According to an embodiment, when logic '1' is stored in the data cell, the second time may precede the first time.

According to an embodiment, a first reference voltage sampled at the first time may be lower than a second reference voltage at the second time.

According to an embodiment of the present disclosure, a nonvolatile resistive memory device includes a cell array including a data cell and a reference cell, and a read circuit that reads data stored in the data cell through a first bit line connected to the data cell and a second bit line connected to the reference cell, and the read circuit samples a voltage developed to the second bit line as a reference voltage at a first time when a voltage developed to the first bit line reaches a threshold voltage.

According to an embodiment, the read circuit may sample the voltage developed to the first bit line as a data voltage at a second time when the voltage developed to the second bit line reaches the threshold voltage.

According to an embodiment, the read circuit may compare the reference voltage sampled at the first time with the data voltage sampled at the second time to determine a logic value stored in the data cell.

According to an embodiment, the read circuit may include a time domain detecting circuit that senses levels of the voltages developed to the first bit line and the second bit line to generate a sampling control signal, a sample/hold circuit that samples and holds the reference voltage at the first time, and samples and holds the data voltage at the second time, in response to the sampling control signal, and a sense amplifier that compares the reference voltage with the data voltage and outputs a result of the comparison as output data.

According to an embodiment, the time domain detecting circuit may include a first half schmitt trigger that generates a first reference sampling control signal that controls to sample the reference voltage when the level of the voltage developed to the first bit line reaches the threshold voltage, a first inverter that inverts the first reference sampling control signal to generate a second reference sampling control signal, a second half schmitt trigger that generates a first data sampling control signal that controls to sample the data voltage when the level of the voltage developed to the second bit line reaches the threshold voltage, and a second inverter that inverts the first data sampling control signal to generate a second data sampling control signal.

According to an embodiment, the threshold voltage may be set depending on sizes of transistors configuring the first half schmitt trigger and the second half schmitt trigger.

According to an embodiment, the sample/hold circuit may include a first transmission gate that transfers the voltage developed to the first bit line at the second time in response to the first to second data sampling control signals, a first holding capacitor that stores the voltage transferred by the first transmission gate as the data voltage, a second transmission gate that transfers the voltage developed to the second bit line at the first time in response to the first to second reference sampling control signals, and a second holding capacitor that stores the voltage transferred by the second transmission gate as the reference voltage.

According to an embodiment, the sense amplifier may be activated after sampling of the reference voltage and the data voltage is completed.

According to an embodiment, the read circuit may include first and second precharge switches that respectively charges the first bit line and the second bit line to a precharge voltage in response to a precharge control signal, and first and second discharge switches that discharges the precharge voltage charged to the first bit line through the data cell, and discharges the precharge voltage charged to the second bit line through the reference cell, in response to a discharge control signal.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, some embodiments of the present disclosure will be described in detail with reference to the accompanying drawings. In adding reference numerals to components of each drawing, the identical components may have the identical reference numerals as much as possible even though they are displayed on other drawings. Further, in describing the embodiment of the present disclosure, the detailed description of the related known configuration or function will be omitted when it is determined that it interferes with the understanding of the embodiment of the present disclosure.

Figure 1:
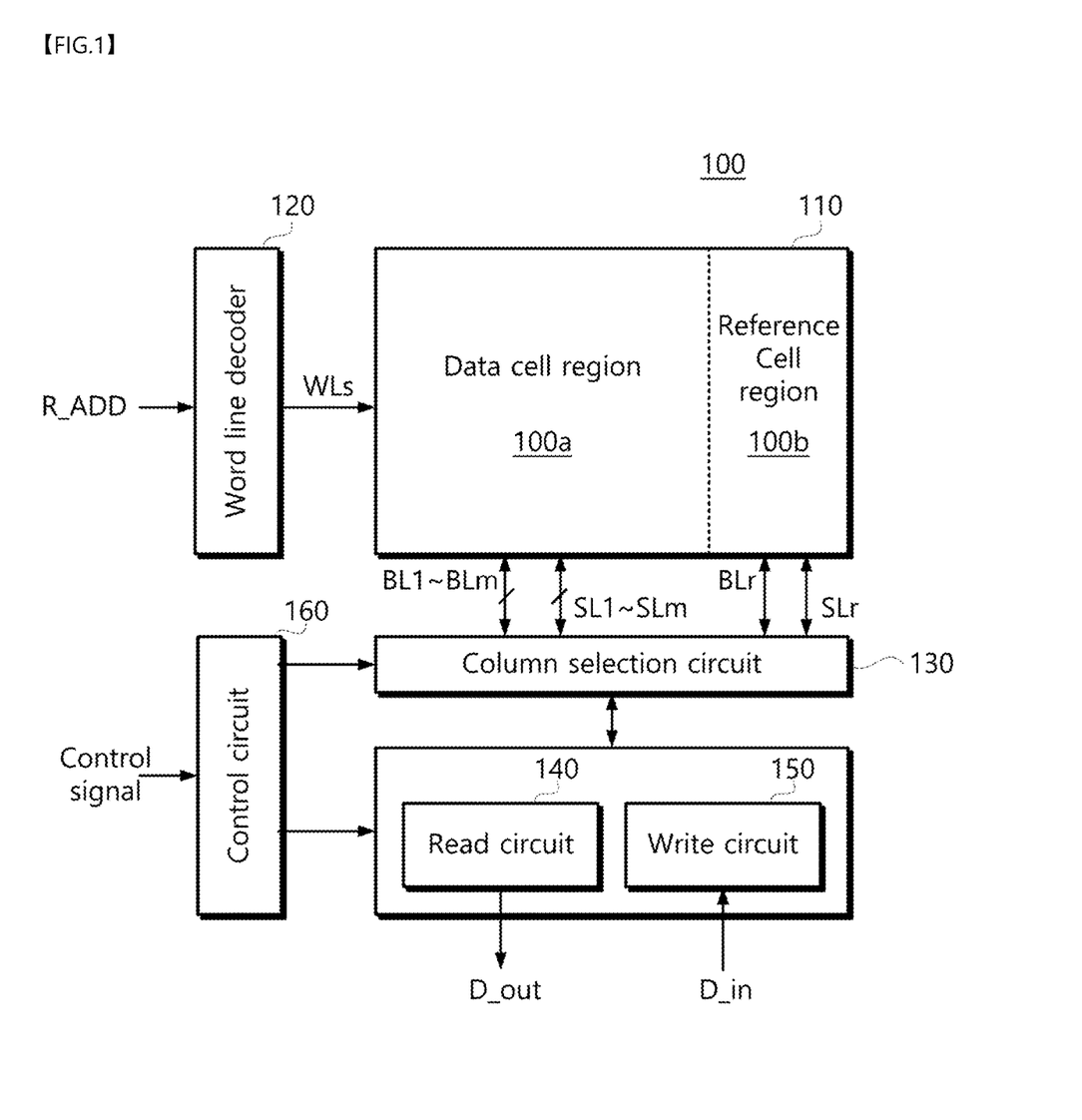
FIG. 1 is a block diagram illustrating a resistive memory device, according to an embodiment of the present disclosure.

FIG. 1 is a block diagram illustrating a resistive memory device, according to an embodiment of the present disclosure. Referring to FIG. 1, a resistive memory device 100 includes a cell array 110, a word line decoder 120, a column selection circuit 130, a read circuit 140, a write circuit 150, and a control circuit 160.

The cell array 110 may include a plurality of resistive memory cells. The resistive memory cells receive a write voltage or a read voltage through a word line WLs and bit lines BLm and BLr. The cell array 110 includes a data cell region 110a and a reference cell region 110b. The data cell region 110a is a region in which data input externally are actually written, and the reference cell region 110b is a reference region for providing a reference voltage for reading the data cell region 110a.

Data provided from the outside of the resistive memory device 100 are stored in the data cell region 110a. In addition, reference cells for providing the reference voltage are formed in the reference cell region 110b. Whether the data stored in the data cell region 110a is a logic '1' or a logic '0' may be identified with reference to the reference voltage. When any one word line WL0 is selected to output data, a memory cell of the data cell region 110a and a reference cell of the reference cell region 110b will be selected.

The word line decoder 120 selects one of a plurality of word lines of the cell array 110 by decoding a row address R_ADD. The word line decoder 120 may provide a read word line voltage RWL to a selected word line, and may provide a cutoff voltage to unselected word lines, during a read operation. The word line decoder 120 may further include driver circuits for generating the read word line voltage RWL or the cutoff voltage.

The column selection circuit 130 may select at least one of a plurality of bit lines BL1 to BLm and BLr with reference to a column address C_ADD. In addition, the column selection circuit 130 may select at least one of a plurality of source lines SL1 to SLm and SLr according to the column address C_ADD. The column selection circuit 130 may connect at least one bit line of the bit lines BL1 to BLm of the data cell region 110a and the bit line BLr of the reference cell region 110b to the read circuit 140 or the write circuit 150, in response to the column address C_ADD.

The read circuit 140 senses data written in the selected cell array 110 under a control of the control circuit 160 and outputs the sensed data to the outside as output data D_out.

In detail, the read circuit 140 of the present disclosure may vary a sampling time of the reference cell depending on a logic value stored in a data cell. That is, the read circuit 140 may vary a sampling time of the reference cell depending on a logic value stored in the data cell, instead of using the fixed reference voltage provided by the reference cell. In detail, the read circuit 140 of the present disclosure may increase a sensing margin through a dynamic reference technology that varies the sampling time of the reference voltage. To this end, the read circuit 140 may include a time domain detecting circuit and a sample/hold circuit. The operation of these components will be described in detail with reference to FIG. 3 to be described later.

The write circuit 150 writes write data D_in input under a control of the control circuit 160 into the cell array 110. The write circuit 150 may provide a write voltage or a write current to the selected bit line BL.

The control circuit 160 may control the read circuit 140, the write circuit 150, and the word line decoder 120 in response to a write command, a read command, or a control signal. The control circuit 160 controls the read circuit 140, the write circuit 150, and the word line decoder 120 to synchronize a voltage of the word line WLs with a voltage of the bit line BL of the selected memory cell.

As described above, the resistive memory device 100 of the present disclosure uses a reference voltage of which sampling is controlled in a dual domain including a voltage domain and a time domain during a read operation. In detail, a difference between the data voltage and the reference voltage may be amplified by varying the sampling time of the reference voltage provided by the reference cell depending on the logic value stored in the data cell. The reference voltage has a larger difference from the data voltage provided by the data cell according to the dynamic variation of the sampling time. The read circuit 140 of the present disclosure may utilize the dynamic reference voltage in the dual domain to increase a read margin and may increase the reliability of read data.

Figure 2:
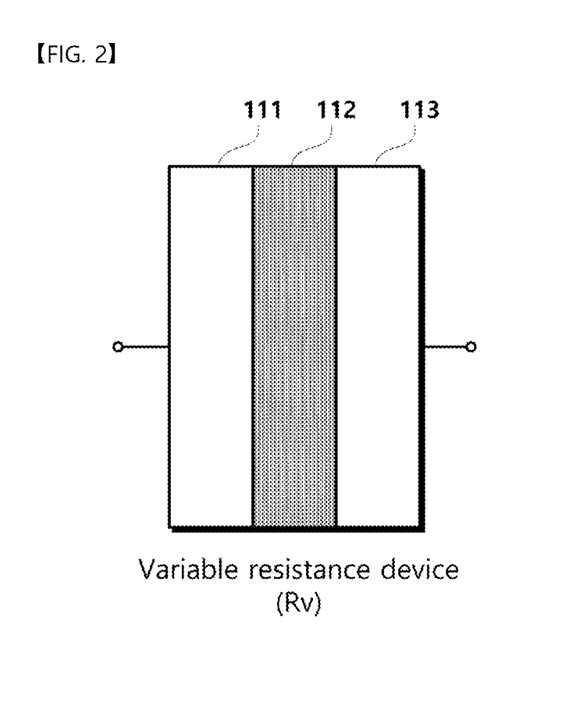
FIG. 2 is a diagram illustrating an example of a resistive memory device constituting a memory cell of a resistive memory device.

FIG. 2 is a diagram illustrating an example of a resistive memory device constituting a memory cell of a resistive memory device. Referring to FIG. 2, a memory cell includes a selection device (e.g., a transistor) connected to a word line and a variable resistance device Rv for storing data.

The variable resistance device Rv may include a pair of electrodes 111 and 113 and a data storage film 112 formed between the electrodes 111 and 113. The data storage film 112 may be formed of a bipolar resistance storage material or a unipolar resistance storage material. The bipolar resistance storage material is programmed to a set (or logic 1) or reset (or logic 0) state by a polarity of a pulse. The unipolar resistance storage material may be programmed to a set or reset state by the same pulse polarity. The unipolar resistance storage material includes single transition metal oxide such as $NiO_x$ or $TiO_x$. The bipolar resistance storage material includes perovskite-based materials.

In the above, a variable resistance device has been described as an example of the resistive memory device of the present disclosure. However, resistive memory devices are not limited to the disclosure herein. It will be well understood that the resistive memory device may be provided in the form of any one of an STT-MRAM, a PRAM, and an FRAM.

Figure 3:
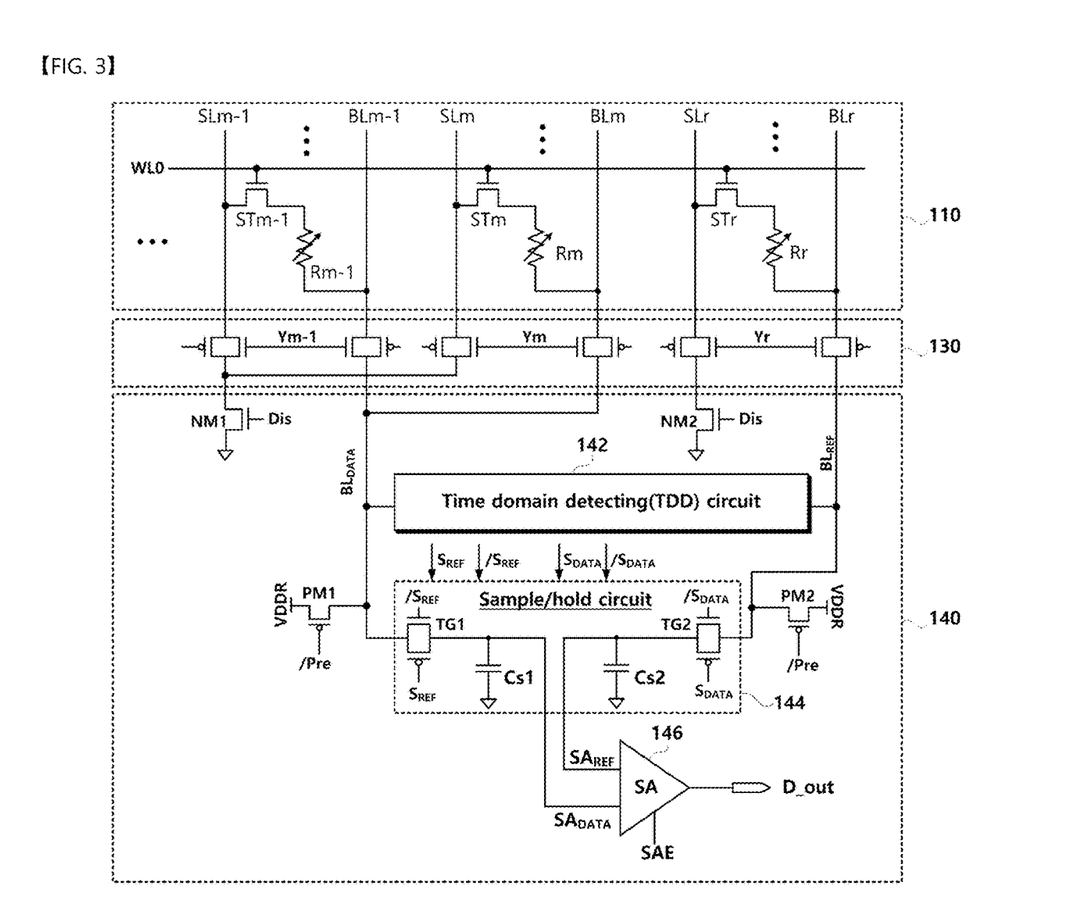
FIG. 3 is a circuit diagram specifically illustrating a configuration of a read circuit, according to the present disclosure.

FIG. 3 is a circuit diagram specifically illustrating a configuration of a read circuit, according to the present disclosure. Referring to FIG. 3, a connection relationship between the components of the cell array 110, the column selection circuit 130, and the read circuit 140 is illustrated.

The cell array 110 includes data cells and reference cells. Each of the data cells includes one of selection transistors ST1 to STm and a variable resistance device Rn, and each of the reference cells includes a selection transistor STr and a reference variable resistance device Rr. When a read selection voltage VRWL is provided to the word line (assumed to be WL0) selected during a read operation, the selection transistors ST1 to STm and STr are turned on, and the variable resistance devices R1 to Rm and Rr of the selected row are connected to the source lines SL1 to SLm and SLr, respectively.

The column selection circuit 130 selectively connects the plurality of bit lines BL1 to BLm and BLr and the plurality of source lines SL1 to SLm and SLr to the read circuit 140 in response to column selection signals Y1 to Ym and Yr generated from the column address C_ADD.

The read circuit 140 may sample the reference voltage of the precharged bit line and the precharged reference bit line using a dynamic reference sampling technique in the voltage domain and the time domain. According to application of dynamic reference sampling, a level difference between the read voltage provided from the selected memory cell and the reference voltage provided from the reference cell may be amplified and sampled. For the dynamic reference sampling, the read circuit 140 may include a time domain detecting circuit 142 and a sample/hold circuit 144. A read operation of the read circuit 140 performing dynamic reference sampling is as follows.

The read circuit 140 precharges the selected bit line and the reference bit line during the read operation. For example, when column selection signals Ym and Yr are activated, the read circuit 140 provides a precharge signal /Pre being a low level to turn on precharge switches PM1 and PM2 to sense the data stored in the variable resistance device Rm. Then, the precharge switches PM1 and PM2 are turned on, and a precharge source voltage VDDR is transferred to the bit line BLm and the reference bit line BLr to be charged. The read circuit 140 develops and samples voltages of the precharged bit lines BLm and BLr to identify the data stored in the variable resistance device Rm. To this end, the read circuit 140 activates a discharge signal Dis to a high level to turn on discharge switches NM1 and NM2.

The time domain detecting circuit 142 senses levels of the developed voltages of each of the bit lines BLm and BLr to generate sampling control signals $S_{REF}$, $/S_{REF}$, $S_{DATA}$, and/ $S_{DATA}$ for controlling the sample/hold circuit 144. The time domain detecting circuit 142 generates the sampling control signals $S_{REF}$, $/S_{REF}$, $S_{DATA}$, and IS DATA such that the reference voltage is sampled and held when the bit line voltage of the memory cell reaches a threshold voltage $V_T$ as the bit line is discharged. In general, a resistance of the memory cell in which data of logic '0' are stored is less than a resistance of the memory cell in which data of logic '1' are stored. Accordingly, the bit line discharge rate of the memory cell storing the data of logic '0' is greater than the bit line discharge rate of the memory cell storing the data of the logic '1'. Accordingly, the bit line voltage of the memory cell in which data of logic '0' are stored by the bit line development will first reach the threshold voltage $V_T$. In this case, the bit line of the memory cell in which data are stored will be referred to as a data bit line, and the bit line of the reference cell will be referred to as a reference bit line. The time domain detecting circuit 142 generates the sampling control signals $S_{REF}$, $/S_{REF}$, $S_{DATA}$, and/$S_{DATA}$ for varying sampling and holding times with respect to the reference bit line depending on the discharge rate of the data bit line.

The sample/hold circuit 144 samples and holds voltages of the data bit line $BL_{DATA}$ and the reference bit line $BL_{REF}$ in response to the sampling control signals $S_{REF}$, $/S_{REF}$, $S_{DATA}$, and $/S_{DATA}$. A sampling time of the data bit line $BL_{DATA}$ is determined depending on a voltage change of the reference bit line $BL_{REF}$. Since the reference bit line $BL_{REF}$ is always discharged at the same rate, the sampling time with respect to the data bit line $BL_{DATA}$ may be considered to be fixed. In contrast, since the discharge rate of the data bit line $BL_{DATA}$ varies depending on the logic value stored in the memory cell, the discharge rate of the data bit line $BL_{DATA}$ varies depending on the data stored in the memory cell. As a result, the sample/hold circuit 144 samples a voltage of the data bit line $BL_{DATA}$ at a fixed time and samples a voltage of the reference bit line $BL_{REF}$ at a variable time.

In detail, the sample/hold circuit 144 samples a voltage of the data bit line $BL_{DATA}$ in response to the sampling control signals $S_{REF}$ and $/S_{REF}$ that turn on a transmission gate TG1 at a fixed time, when the develop operation starts. In addition, the sampled voltage is maintained by using a first holding capacitor Cs1. The data voltage $SA_{DATA}$ may be held by sampling and holding the voltage of the data bit line $BL_{DATA}$. In contrast, the sample/hold circuit 144 samples a voltage of the reference bit line $BL_{REF}$ in response to the sampling control signals $S_{DATA}$ and $/S_{DATA}$ that turn on a transmission gate TG2 at a variable time after the develop operation is started, and holds the sampled voltage using a second holding capacitor Cs2. A reference voltage $SA_{REF}$ may be held by sampling and holding the voltage of the reference bit line $BL_{REF}$.

A sense amplifier 146 compares the data voltage $SA_{DATA}$ with the reference voltage $SA_{REF}$ when the sampling and holding with respect to the data bit line $BL_{DATA}$ and the reference bit line $BL_{REF}$ is completed, and outputs the comparison result as output data. For example, when the data voltage $SA_{DATA}$ is greater than the reference voltage $SA_{REF}$, the sense amplifier 146 may output logic '1' as the output data D_out. For example, when the data voltage $SA_{DATA}$ is less than the reference voltage $SA_{REF}$, the sense amplifier 146 may output logic '0' as the output data D_out.

By the operation of the read circuit 140 described above, the sampling time of the reference cell may vary depending on the data value stored in the data cell. Accordingly, the difference between the data voltage $SA_{DATA}$ and the reference voltage $SA_{REF}$ may be further amplified and provided to the sense amplifier 146.

Figure 4:
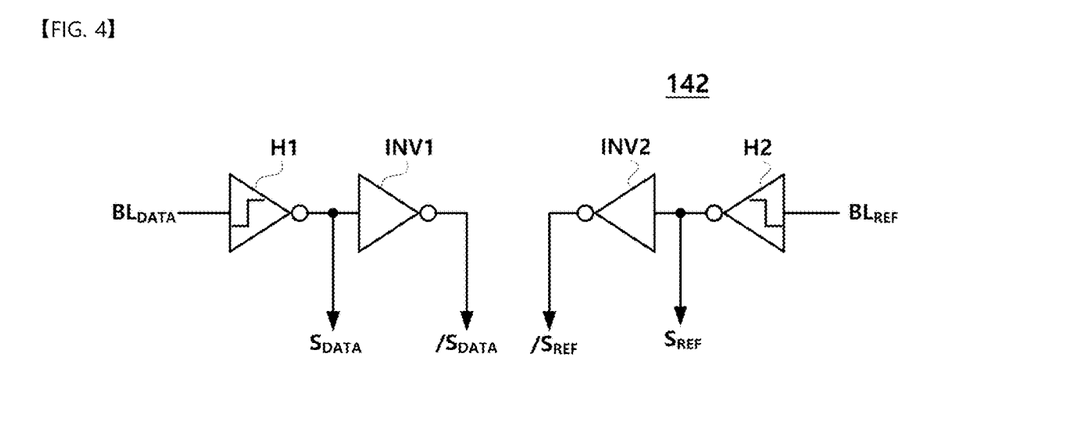
FIG. 4 is a circuit diagram illustrating a basic operation of a time domain detecting circuit illustrated in FIG. 3.

FIG. 4 is a circuit diagram illustrating a basic operation of a time domain detecting circuit illustrated in FIG. 3. Referring to FIG. 4, the time domain detecting circuit 142 includes half schmitt triggers H1 and H2, and inverters INV1 and INV2.

The first half schmitt trigger H1 and the first inverter INV1 generate the sampling control signals $S_{DATA}$ and/$S_{DATA}$ for sampling and holding the voltage of the reference bit line $BL_{REF}$. The first half schmitt trigger H1 generates the sampling control signal $S_{DATA}$ when the voltage of the data bit line $BL_{DATA}$ reaches the threshold voltage $V_T$ by the development operation. In addition, the first inverter INV1 inverts the sampling control signal $S_{DATA}$ to output the sampling control signal/$S_{DATA}$. The first half schmitt trigger H1 will generate the sampling control signal $S_{DATA}$ having a high-level when the level of the data bit line $BL_{DATA}$ becomes the same as the level of the threshold voltage $V_T$.

The second half schmitt trigger H2 and the second inverter INV2 generate the sampling control signals $S_{REF}$ and/$S_{REF}$ for sampling and holding the voltage of the data bit line $BL_{DATA}$ The second half schmitt trigger H2 generates the sampling control signal $S_{REF}$ when the voltage of the reference bit line $BL_{REF}$ reaches the threshold voltage $V_T$ by the development operation. In addition, the second inverter INV2 inverts the sampling control signal $S_{REF}$ to output the sampling control signal /$S_{REF}$. The second half schmitt trigger H2 will generate the sampling control signal $S_{REF}$ having a high-level when the level of the reference bit line $BL_{REF}$ becomes the same as the level of the threshold voltage $V_T$. The second inverter INV2 inverts the sampling control signal $S_{REF}$.

Figure 5:
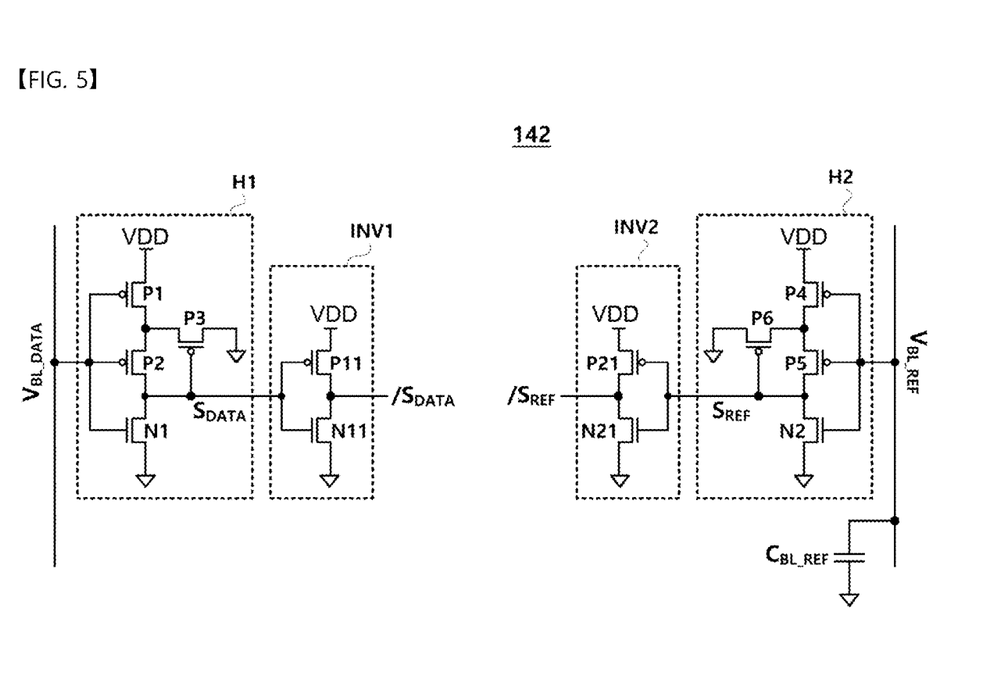
FIG. 5 is a circuit diagram illustrating a detailed configuration of a time domain detecting circuit of FIG. 4.

FIG. 5 is a circuit diagram illustrating a detailed configuration of a time domain detecting circuit of FIG. 4. Referring to FIG. 5, the time domain detecting circuit 142 includes the half schmitt triggers H1 and H2 and inverters INV1 and INV2 for setting the appropriate threshold voltage $V_T$.

The first half schmitt trigger H1 is triggered when the voltage $V_{BL\_DATA}$ of the data bit line $BL_{DATA}$ becomes lower than the threshold voltage $V_T$. In the bit line develop operation, the data bit line voltage $V_{BL\_DATA}$ is lowered by discharging from the precharged state. The first half schmitt trigger H1 is provided as a half schmitt trigger triggered only when the level of the data bit line voltage $V_{BL\_DATA}$ becomes lower than the threshold voltage $V_T$. The level of the threshold voltage $V_T$ may be adjusted by adjusting the sizes of PMOS transistors P1 and P2 and an NMOS transistor N1 receiving the data bit line voltage $V_{BL\_DATA}$.

The PMOS transistors P1 and P2 switch a power supply voltage VDD in response to the data bit line voltage $V_{BL\_DATA}$. In detail, the PMOS transistors P1 and P2 are turned off when the data bit line voltage $V_{BL\_DATA}$ is greater than the threshold voltage $V_T$, and are turned on when the data bit line voltage $V_{BL\_DATA}$ is lower than the threshold voltage $V_T$. The PMOS transistor P3 stably maintains a level of the sampling control signal $S_{DATA}$, which is the level of an output terminal of the first half schmitt trigger H1. In contrast to the PMOS transistors P1 and P2, the NMOS transistor N1 pulls down the output terminal of the first half schmitt trigger H1 in response to the data bit line voltage $V_{BL\_DATA}$. The first inverter INV1 inverts the sampling control signal $S_{DATA}$ to output the sampling control signal /$S_{DATA}$.

The second half schmitt trigger H2 and the second inverter INV2 are actually the same as the first Half Schmitt trigger H1 and the first inverter INV1, except that a voltage to be sensed is a reference bit line voltage $V_{BL\_REF}$. The threshold voltage $V_T$ at the same level as that of the first half schmitt trigger H1 should be set by adjusting the sizes of PMOS transistors P4 and P5 and an NMOS transistor N2 also in the second half schmitt trigger H2.

Figure 6:
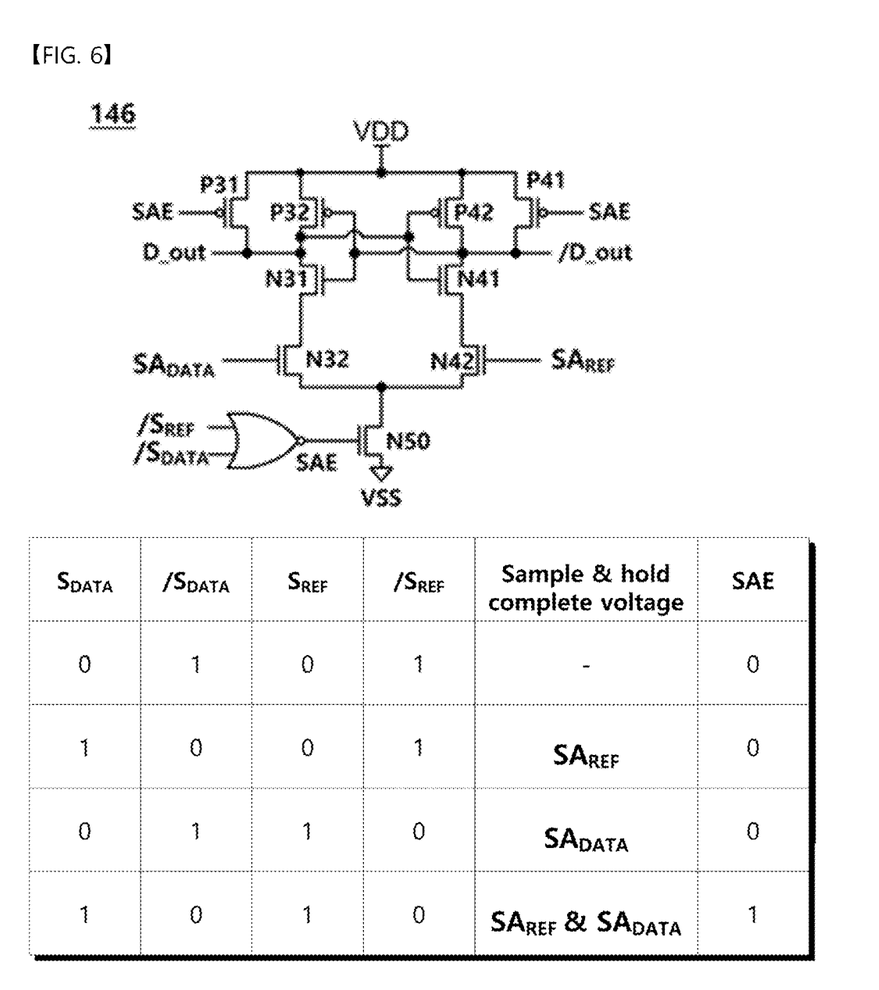
FIG. 6 is a diagram illustrating a detailed configuration and operation of a sense amplifier of FIG. 3.

FIG. 6 is a diagram illustrating a detailed configuration and operation of a sense amplifier of FIG. 3. Referring to FIG. 6, a sensing enable signal SAE of the sense amplifier 146 is activated when sampling and holding of the data voltage $SA_{DATA}$ and the reference voltage $SA_{REF}$ are completed.

The sense amplifier 146 is provided to sense a voltage difference between the data bit line $BL_{DATA}$ and the reference bit line $BL_{REF}$, and may include PMOS transistors P31, P32, P41, and P42, NMOS transistors N32, N32, N41, N42, and N50, and a NOR gate. In particular, the sensing enable signal SAE corresponding to an output of the NOR gate is activated after sampling of the data voltage $SA_{DATA}$ and the reference voltage $SA_{REF}$ is completed, as may be seen from a truth table illustrated below of the corresponding drawing. Referring to the time domain sensing circuit 142 of FIG. 4, when the sampling control signal $S_{REF}$ transitions to logic '1', the data voltage $SA_{DATA}$ is sampled. In addition, when the sampling control signal $S_{DATA}$ transitions to logic '1', the reference voltage $SA_{REF}$ is sampled. Accordingly, after all of the sampling control signals $S_{DATA}$ and $S_{REF}$ are transitioned to logic '1', the sensing enable signal SAE, which is the output of the NOR gate, may be activated as logic '1'. In contrast, when any one of the sampling control signals $S_{DATA}$ and $S_{REF}$ is logic '0', the sensing enable signal SAE, which is the output of the NOR gate, will maintain logic '0'.

Figure 7:
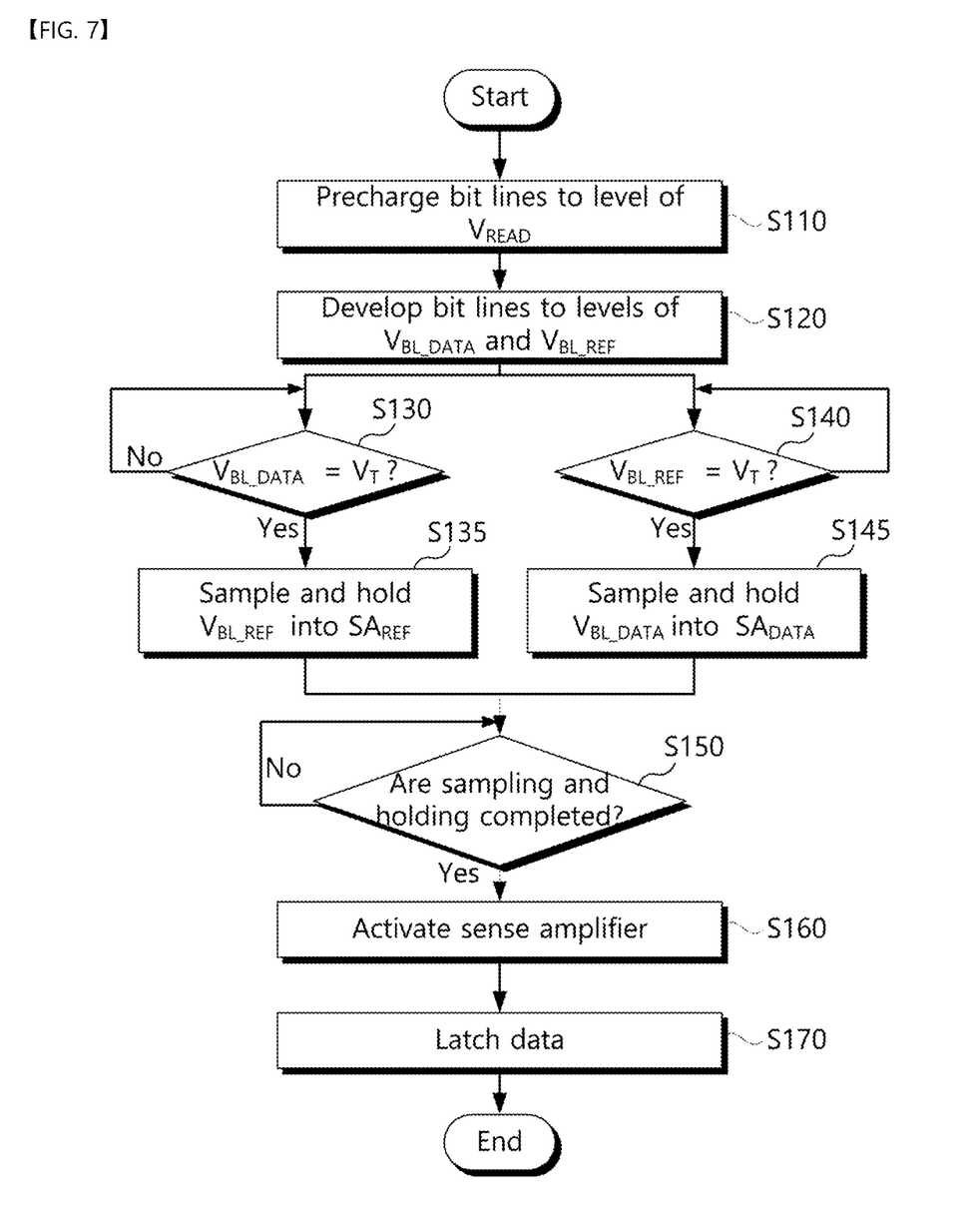
FIG. 7 is a flowchart illustrating a method of reading a resistive memory cell, according to an embodiment of the present disclosure.

FIG. 7 is a flowchart illustrating a method of reading a resistive memory cell, according to an embodiment of the present disclosure. Referring to FIGS. 3 and 7, the dynamic reference voltage of the dual domain in which the sampling time and the level of the reference cell are varied depending on a data value stored in the data cell may be provided by the time domain detecting circuit 142 and the sample/hold circuit 144 of the present disclosure.

In operation S110, a bit line precharge operation by the read circuit 140 is performed for a read operation with respect to the selected memory cells. First, bit lines of a data cell and a reference cell selected by the read circuit 140 are precharged. When the variable resistance device Rm is sensed, the column selection signals Ym and Yr are activated. In addition, the read circuit 140 provides the precharge signal /Pre having a low level to turn on the precharge switches PM1 and PM2. Then, the precharge switches PM1 and PM2 are turned on, and the data bit line BLm and the reference bit line BLr are respectively charged to a level of a precharge voltage $V_{READ}$ by the precharge source voltage VDDR.

In operation S120, the read circuit 140 develops each of the data bit line BLm and the reference bit line BLr. That is, the read circuit 140 connects the precharged bit lines BLm and BLr to the source lines to identify data stored in the variable resistance device Rm, and will sense a voltage change. To this end, the read circuit 140 activates the discharge signal Dis to a high level to turn on the discharge switches NM1 and NM2. Then, the source lines SLm and SLr are connected to a ground. In addition, as the read voltage is provided to the word line WL0 by the word line decoder 120 (refer to FIG. 1), the selection transistors STm and STr are turned on, and the variable resistance devices Rm and Rr are connected to the ground. Accordingly, discharging of the precharge voltage $V_{READ}$ charged in each of the data bit line BLm and the reference bit line BLr may start.

In operation S130, the time domain detecting circuit 142 senses whether the level of the bit line voltage $V_{BL\_DATA}$ developed to the data bit line BLm reaches the threshold voltage $V_T$. The half schmitt trigger H1 of the time domain detecting circuit 142 activates the sampling control signals $S_{DATA}$ and /$S_{DATA}$ when the level of the bit line voltage $V_{BL\_DATA}$ falling by the discharge is the same as the preset threshold voltage $V_T$. For example, when the level of the bit line voltage $V_{BL\_DATA}$ becomes the same as the preset threshold voltage $V_T$, the sampling control signal $S_{DATA}$ transitions from a low level to a high level. Then, the inverted sampling control signal /$S_{DATA}$ will transition from the high level to the low level.

In operation S135, in synchronization with the transition of the sampling control signals $S_{DATA}$ and /$S_{DATA}$ reflecting the development state of the data bit line BLm, the sample/hold circuit 144 samples and holds the reference bit line voltage $V_{BL\_REF}$. The bit line discharge rate of the memory cell in which data of logic '0' are stored in the variable resistance device Rm is faster than that of when logic '1' is stored. Accordingly, in the read operation of the memory cell in which data of logic '0' are stored, the sampling time of the reference bit line voltage $V_{BL\_REF}$ becomes earlier than that of the read operation of logic '1'. When the sampling time of the reference bit line discharged at a fixed rate is earlier, the relatively high reference voltage $SA_{REF}$ is sampled and held.

In operation S140, the time domain detecting circuit 142 senses whether the level of the bit line voltage $V_{BL\_REF}$ developed to the reference bit line BLr reaches the threshold voltage $V_T$. The half schmitt trigger H2 of the time domain detecting circuit 142 activates the sampling control signals $S_{REF}$ and/$S_{REF}$ when the level of the bit line voltage $V_{BL\_REF}$ falling by the discharge is the same as the preset threshold voltage $V_T$. For example, when the level of the bit line voltage $V_{BL\_REF}$ becomes the same as the preset threshold voltage $V_T$, the sampling control signal $S_{REF}$ transitions from a low level to a high level. Then, the inverted sampling control signal /$S_{REF}$ will transition from the high level to the low level.

In operation S145, in synchronization with the transition of the sampling control signals $S_{REF}$ and/$S_{REF}$ reflecting the development state of the reference bit line BLr, the sample/hold circuit 144 samples and holds the data bit line voltage $V_{BL\_DATA}$. The variable resistance device Rr of the reference cell is fixed to a resistance value corresponding to the average value of each case in which the logic '0' and the logic '1' are stored. Accordingly, the discharge rate of the reference bit line BLr may be regarded as uniform based on the fixed resistance value. The sampling time of the data bit line, at which the sampling time is determined according to the discharge rate of the reference bit line BLr, may be fixed. Accordingly, the sampled data voltage $SA_{DATA}$ will reflect the logic value '0' or '1' stored in the memory cell.

In operation S150, it is checked whether sampling and holding of the data voltage $SA_{DATA}$ and the reference voltage $SA_{REF}$ are completed through the sample/hold circuit 144. Actually, the sampling and holding timings of the data bit line BLm and the reference bit line BLr are inevitably different due to the dynamic reference sampling technique. That is, during a read operation of a memory cell in which logic '0' is stored, sampling and holding of the reference voltage $SA_{REF}$ are completed earlier. In contrast, during the read operation of the memory cell in which the logic '1' is stored, the sampling and holding of the reference voltage $SA_{REF}$ will be later than the sampling and holding of the data voltage $SA_{DATA}$. When the sampling and holding of the data voltage $SA_{DATA}$ and the reference voltage $SA_{REF}$ are completed (Yes direction), the procedure moves to operation S160. On the other hand, when it is determined that the sampling and holding of the data voltage $SA_{DATA}$ and the reference voltage $SA_{REF}$ are not completed (No direction), the subsequent procedure may wait until the sampling and holding of both the data voltage $SA_{DATA}$ and the reference voltage $SA_{REF}$ is completed.

In operation S160, when sampling and holding of both the data voltage $SA_{DATA}$ and the reference voltage $SA_{REF}$ are completed, an enable signal SAE for activating the sense amplifier 146 is provided.

In operation S170, the sense amplifier 146 compares the data voltage $SA_{DATA}$ with the reference voltage $SA_{REF}$ to determine whether the read data are the logic '0' or the logic '1'. The sense amplifier 146 may provide the comparison result as the output data D_out.

According to the above-described resistive memory reading method, the sampling and holding time of the reference bit line may be varied by using the characteristic that the development speed of the bit line is different according to the logic value stored in the data cell. When the development speed of the data bit line is fast (e.g., in a logic '0' read), the sampling time of the reference bit line is advanced, and the level of the sampled reference voltage $SA_{REF}$ is relatively increased. In contrast, when the development rate of the data bit line is slow (e.g., in a logic '1' read), the sampling time of the reference bit line is relatively delayed, and the level of the sampled reference voltage $SA_{REF}$ is relatively decreased. As a result, the difference between the reference voltage and the data voltage in the voltage domain and the time domain may be amplified by varying the sampling time of the reference voltage $SA_{REF}$ developed to the reference bit line with reference to the development speed of the data bit line.

Figure 8:
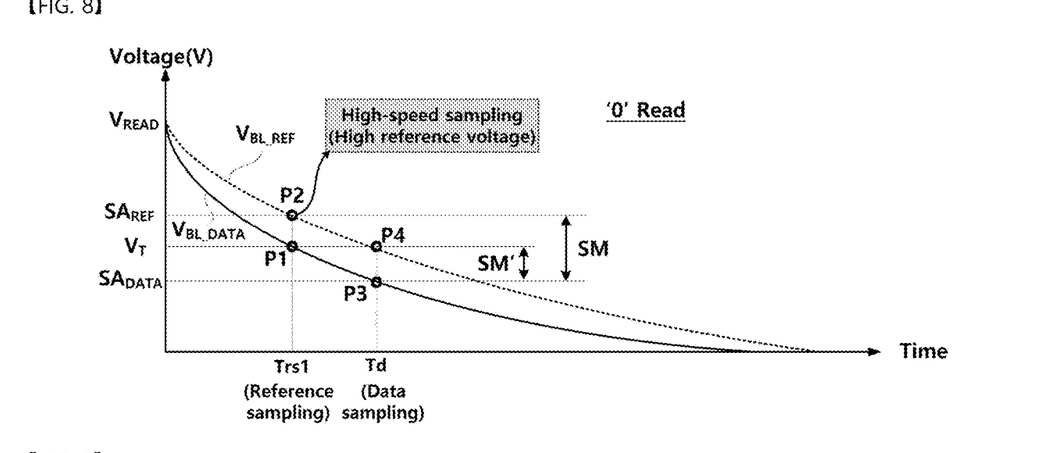
FIG. 8 is a graph illustrating development trends of a data bit line and a reference bit line during a read operation of logic '0'.

FIG. 8 is a graph illustrating development trends of a data bit line and a reference bit line during a read operation of logic '0'. Referring to FIG. 8, during a read operation of a memory cell in which data of logic '0' are stored, the sampling of the reference bit line voltage $V_{BL\_REF}$ occurs faster than the sampling of the data bit line voltage $V_{BL\_DATA}$ at a sampling and holding time Trs1 of the reference bit line $BL_{REF}$.

During the develop operation, a change in the reference bit line voltage $V_{BL\_REF}$ developed to the reference bit line $BL_{REF}$ is indicated by a dotted line. In addition, the data bit line voltage $V_{BL\_DATA}$ developed to the data bit line $BL_{DATA}$ during the develop operation is indicated by a solid line. The data bit line $BL_{DATA}$ and the reference bit line $BL_{REF}$ are charged to the precharge voltage $V_{READ}$ by the precharge operation, and are discharged by the develop operation.

During the develop operation, the discharge rate of the data bit line $BL_{DATA}$ of the memory cell in which the logic '0' is stored is faster than the discharge rate of the reference bit line $BL_{REF}$. Accordingly, a point P1 at which the data bit line voltage $V_{BL\_DATA}$ reaches the threshold voltage $V_T$ corresponds to the first sampling time Trs1. Accordingly, the first sampling time Trs1 at which the bit line voltage $V_{BL\_DATA}$ of the data bit line $BL_{DATA}$ reaches the threshold voltage $V_T$ becomes the reference sampling time for sampling and holding the reference bit line voltage $V_{BL\_REF}$. When a level (a point P2) of the reference bit line voltage $V_{BL\_REF}$ is sampled at the first sampling time Trs1, the sampled voltage becomes the reference voltage $SA_{REF}$ input to the sense amplifier 146.

On the other hand, a point P4 at which the reference bit line voltage $V_{BL\_REF}$ reaches the threshold voltage $V_T$ corresponds to a data sampling time Td. In addition, the data sampling time Td becomes the reference sampling time for sampling and holding the data bit line voltage $V_{BL\_DATA}$. When a level (a point P3) of the data bit line voltage $V_{BL\_DATA}$ is sampled at the data sampling time Td, the sampled voltage becomes the data voltage $SA_{DATA}$ input to the sense amplifier 146.

When the logic '0' data is read, the sampling time of the reference bit line becomes earlier than the data sampling time, and consequently, a higher reference voltage $SA_{REF}$ may be provided to the sense amplifier 146. As a result, it may be seen that a sensing margin SM is significantly increased than a sensing margin SM' when the reference bit line and the data bit line are simultaneously sampled.

Figure 9:
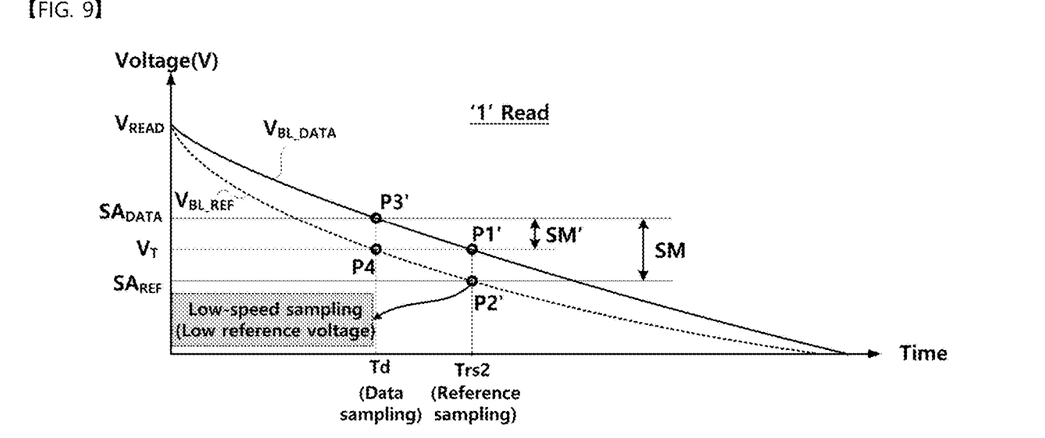
FIG. 9 is a graph illustrating development trends of a data bit line and a reference bit line during a read operation of logic '1'.

FIG. 9 is a graph illustrating development trends of a data bit line and a reference bit line during a read operation of logic '1'. Referring to FIG. 9, during a read operation of a memory cell in which data of logic '1' are stored, sampling of the reference bit line $BL_{REF}$ occurs later than sampling of the data bit line voltage $V_{BL\_DATA}$.

During the develop operation, a change in the reference bit line voltage $V_{BL\_REF}$ developed to the reference bit line $BL_{REF}$ is indicated by a dotted line. In addition, the data bit line voltage $V_{BL\_DATA}$ developed to the data bit line $BL_{DATA}$ during the develop operation is indicated by a solid line. The data bit line $BL_{DATA}$ and the reference bit line $BL_{REF}$ are charged to the precharge voltage $V_{READ}$ by the precharge operation, and are discharged by the develop operation.

During the develop operation, the discharge rate of the data bit line $BL_{DATA}$ of the memory cell in which the logic '1' is stored is slower than the discharge rate of the reference bit line $BL_{REF}$. Accordingly, a point P1' at which the data bit line voltage $V_{BL\_DATA}$ reaches the threshold voltage $V_T$ corresponds to a second sampling time Trs2. The second sampling time Trs2 at which the data bit line voltage $V_{BL\_DATA}$ reaches the threshold voltage $V_T$ becomes a reference sampling time for sampling and holding the reference bit line voltage $V_{BL\_REF}$. When a level (a point P2') of the reference bit line voltage $V_{BL\_REF}$ is sampled at the second sampling time Trs2, the sampled voltage becomes the reference voltage $SA_{REF}$ input to the sense amplifier 146.

On the other hand, a point P4 at which the reference bit line voltage $V_{BL\_REF}$ reaches the threshold voltage $V_T$ corresponds to a data sampling time Td. In addition, the data sampling time Td becomes the reference sampling time for sampling and holding the data bit line voltage $V_{BL\_DATA}$. When a level (a point P3') of the data bit line voltage $V_{BL\_DATA}$ is sampled at the data sampling time Td, the sampled voltage becomes the data voltage $SA_{DATA}$ input to the sense amplifier 146.

When the logic '1' data is read, the sampling time of the reference bit line becomes slower than the data sampling time, and consequently, a lower reference voltage $SA_{REF}$ may be provided to the sense amplifier 146. As a result, it may be seen that the sensing margin SM is significantly increased than the sensing margin SM' when the reference bit line and the data bit line are simultaneously sampled.

Figure 10:
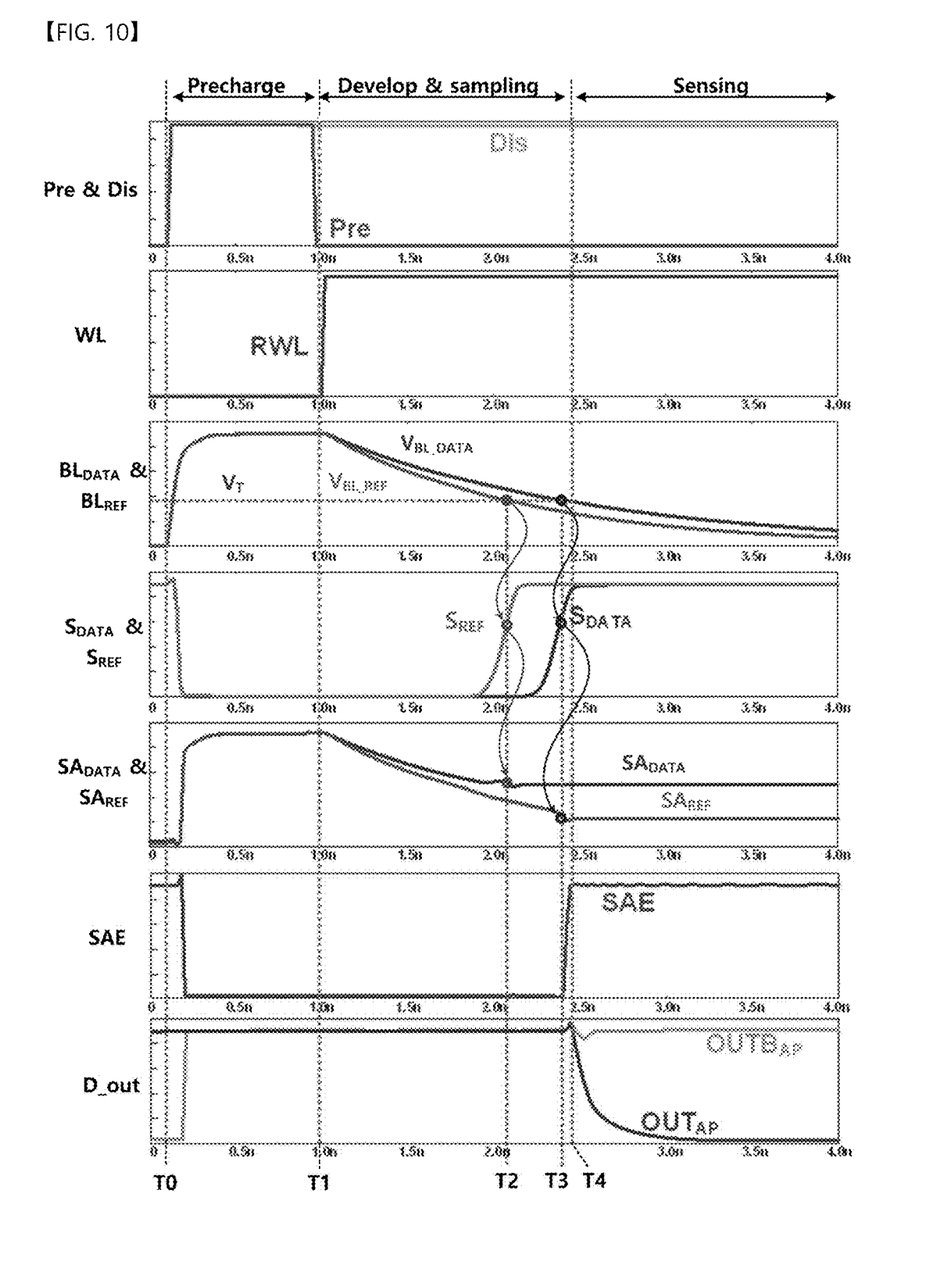
FIG. 10 is a timing diagram illustrating control signals and voltage waveforms of respective nodes of a read circuit for implementing a read method of the present disclosure.

FIG. 10 is a timing diagram illustrating control signals and voltage waveforms of respective nodes of a read circuit for implementing a read method of the present disclosure. Referring to FIG. 10, a read operation when logic '1' is stored in a data cell is illustrated.

At time T0, precharge for a read operation starts. For the precharge operation, the read circuit 140 provides the precharge signal Pre having a high level to turn on the precharge switches PM1 and PM2. In this case, a selection voltage RWL of the word line may be maintained at a low level, and the enable signal SAE of the sense amplifier 146 may be deactivated. Then, the precharge switches PM1 and PM2 are turned on, and the data bit line BLm, the reference bit line BLr, and each of the sensing nodes $BL_{DATA}$ and $BL_{REF}$ are charged to the level of the precharge voltage $V_{READ}$ by the precharge source voltage VDDR.

At time T1, the precharge ends and bit line development and sampling starts. For bit line development, the precharge signal Pre transitions to a low level, and the precharge switches PM1 and PM2 are turned off. In addition, the read circuit 140 activates the discharge signal Dis to a high level to turn on the discharge switches NM1 and NM2. Then, the source lines SLm and SLr are connected to the ground. In addition, the word line read voltage RWL is provided to the word line WL0 by the word line decoder 120 (refer to FIG. 1) to turn on the selection transistors STm and STr. Then, one sides of the variable resistance devices Rm and Rr are connected to the ground, and the other sides of the variable resistance devices Rm and Rr are connected to the sensing nodes $BL_{DATA}$ and $BL_{REF}$, respectively. Accordingly, discharging of the precharge voltage $V_{READ}$ charged in each of the data bit line BLm and the reference bit line BLr may start.

During the development process, as the voltages $V_{BL\_DATA}$ and $V_{BL\_REF}$ of the sensing nodes $BL_{DATA}$ and $BL_{REF}$ are discharged, the voltage level decreases. Since the data stored in the memory cell are logic '1', the discharge rate of the data bit line voltage $V_{BL\_DATA}$ is slower than the discharge rate of the reference bit line voltage $V_{BL\_REF}$. Accordingly, at time T2, the reference bit line voltage $V_{BL\_REF}$ first reaches the threshold voltage $V_T$. Subsequently, at time T3, the data bit line voltage $V_{BL\_DATA}$ will reach the threshold voltage $V_T$.

At the time T2 when the reference bit line voltage $V_{BL\_REF}$ reaches the threshold voltage $V_T$, the sampling control signal $S_{REF}$ is activated to a high level, and the sample/hold circuit 144 samples and hold the data bit line voltage $V_{BL\_DATA}$. The data voltage $SA_{DATA}$ sampled and held by the sampling control signal $S_{DATA}$ is maintained through the sample/hold circuit 144. Subsequently, at the time T3 when the data bit line voltage $V_{BL\_DATA}$ reaches the threshold voltage $V_T$, the sampling control signal $S_{DATA}$ is activated to a high level, and the sample/hold circuit 144 samples and holds the reference bit line voltage $V_{BL\_REF}$. The reference voltage $SA_{REF}$ sampled and held by the sampling control signal $S_{DATA}$ is maintained through the sample/hold circuit 144.

At time T4, the enable signal SAE for activating the operation of the sense amplifier 146 is activated. Then, the sense amplifier 146 compares the data voltage $SA_{DATA}$ with the reference voltage $SA_{REF}$ to determine a logic value of the read data, and will provide the comparison result as the output data D_out.

Figure 11:
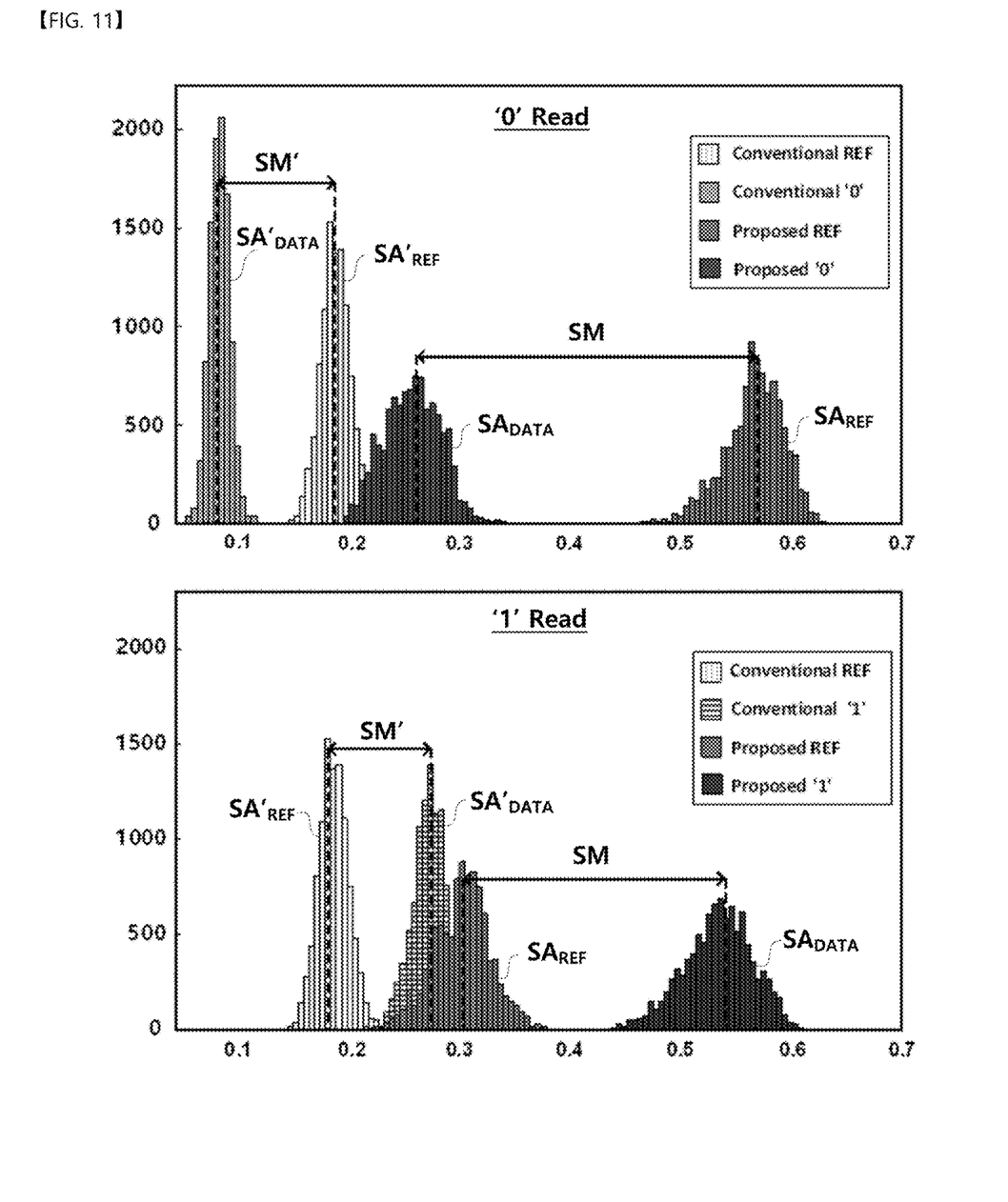
FIG. 11 is a graph illustrating an effect of the present disclosure.

FIG. 11 is a graph illustrating an effect of the present disclosure. Referring to FIG. 11, the distribution of the data voltage $SA_{DATA}$ and the reference voltage $SA_{REF}$ respectively input to the sense amplifier 146 (refer to FIG. 3) during the read operation of data '0' and the read operation of data '1' is illustrated.

The distribution of the data voltage $SA'_{DATA}$ and the reference voltage SA' REF in a general case in which the dynamic reference voltage of the present disclosure is not used during the read operation of data '0' is also illustrated. The reference voltage $SA'_{REF}$ sampled simultaneously with the data voltage $SA'_{DATA}$ provided by the data cell in which the logic '0' is stored is distributed in a relatively narrow voltage band, but the voltage difference or the sensing margin SM' to be identified by the sense amplifier 146 is relatively small. In contrast, when the dynamic reference voltage of the present disclosure is used, the voltage band in which the data voltage $SA_{DATA}$ and the reference voltage $SA_{REF}$ are distributed is relatively wide. However, the voltage difference or the sensing margin SM to be identified by the sense amplifier 146 is much greater than the sensing margin SM' when the dynamic reference voltage is not used.

The distribution of the reference voltage $SA'_{REF}$ and the data voltage $SA'_{DATA}$ in a general case in which the dynamic reference voltage of the present disclosure is not used during the read operation of data '1' is illustrated. It may be seen that the sensing margin SM', which is the difference between the data voltage $SA'_{DATA}$ provided by the data cell in which the logic '1' is stored and the reference voltage $SA'_{REF}$ sampled at the same time, is less than the sensing margin SM when the technology of the present disclosure is applied.

In conclusion, it may be confirmed that the difference value (the sensing margin) between the data voltage $SA_{DATA}$ and the reference voltage $SA_{REF}$ provided to the sense amplifier 146 during the read operation using the dynamic reference voltage of the present disclosure may be dramatically increased. This feature may provide high read reliability even in environments such as process variations or noise.

According to an embodiment of the present disclosure, a resistive memory device that uses a dynamic reference voltage in a dual domain including a time domain and a voltage domain is provided. According to the present disclosure, a high read margin may be provided by using a reference voltage that dynamically changes depending on data stored in a target cell selected for a read operation.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of reading a nonvolatile resistive memory device including a data cell and a reference cell, the method comprising:
   precharging a first bit line connected to the data cell and a second bit line connected to the reference cell;
   discharging a voltage precharged to the first bit line and the second bit line to a source node through the data cell and the reference cell;
   sampling a reference voltage developed to the second bit line at a first time when a voltage of the first bit line reaches a threshold voltage;
   sampling a data voltage developed to the first bit line at a second time when a voltage of the second bit line reaches the threshold voltage; and
   sensing and amplifying a difference value between the reference voltage and the data voltage and outputting the sensed and amplified difference value as output data.

2. The method of claim 1, wherein the first time precedes or follows the second time depending on a logic value stored in the data cell.

3. The method of claim 2, wherein, when logic '0' is stored in the data cell, the first time precedes the second time.

4. The method of claim 3, wherein a first reference voltage sampled at the first time is higher than a second reference voltage at the second time.

5. The method of claim 2, wherein, when logic '1' is stored in the data cell, the second time precedes the first time.

6. The method of claim 5, wherein a first reference voltage sampled at the first time is lower than a second reference voltage at the second time.

7. A nonvolatile resistive memory device comprising:
   a cell array including a data cell and a reference cell; and
   a read circuit configured to read data stored in the data cell through a first bit line connected to the data cell and a second bit line connected to the reference cell,
   wherein the read circuit is configured to sample a voltage developed to the second bit line as a reference voltage at a first time when a voltage developed to the first bit line reaches a threshold voltage, and wherein the read circuit is further configured to sample the voltage developed to the first bit line as a data voltage at a second time when the voltage developed to the second bit line reaches the threshold voltage.

8. The nonvolatile resistive memory device of claim 7, wherein the read circuit compares the reference voltage sampled at the first time with the data voltage sampled at the second time to determine a logic value stored in the data cell.

9. The nonvolatile resistive memory device of claim 7, wherein the read circuit includes:
    a time domain detecting circuit configured to sense levels of the voltages developed to the first bit line and the second bit line to generate a sampling control signal;
    a sample/hold circuit configured to sample and hold the reference voltage at the first time, and to sample and hold the data voltage at the second time, in response to the sampling control signal; and
    a sense amplifier configured to compare the reference voltage with the data voltage and to output a result of the comparison as output data.

10. The nonvolatile resistive memory device of claim 9, wherein the time domain detecting circuit includes:
    a first half schmitt trigger configured to generate a first reference sampling control signal that controls to sample the reference voltage when the level of the voltage developed to the first bit line reaches the threshold voltage;
    a first inverter configured to invert the first reference sampling control signal to generate a second reference sampling control signal;
    a second half schmitt trigger configured to generate a first data sampling control signal that controls to sample the data voltage when the level of the voltage developed to the second bit line reaches the threshold voltage; and
    a second inverter configured to invert the first data sampling control signal to generate a second data sampling control signal.

11. The nonvolatile resistive memory device of claim 10, wherein the threshold voltage is set depending on sizes of transistors configuring the first half schmitt trigger and the second half schmitt trigger.

12. The nonvolatile resistive memory device of claim 10, wherein the sample/hold circuit includes:
    a first transmission gate configured to transfer the voltage developed to the first bit line at the second time in response to the first to second data sampling control signals;
    a first holding capacitor configured to store the voltage transferred by the first transmission gate as the data voltage;
    a second transmission gate configured to transfer the voltage developed to the second bit line at the first time in response to the first to second reference sampling control signals; and
    a second holding capacitor configured to store the voltage transferred by the second transmission gate as the reference voltage.

13. The nonvolatile resistive memory device of claim 9, wherein the sense amplifier is activated after sampling of the reference voltage and the data voltage is completed.

14. The nonvolatile resistive memory device of claim 7, wherein the read circuit includes:
    first and second precharge switches configured to respectively charge the first bit line and the second bit line to a precharge voltage in response to a precharge control signal; and
    first and second discharge switches configured to discharge the precharge voltage charged to the first bit line through the data cell, and to discharge the precharge voltage charged to the second bit line through the reference cell, in response to a discharge control signal.

* * * * *